United States Patent
Du et al.

(10) Patent No.: US 10,983,779 B2
(45) Date of Patent: Apr. 20, 2021

(54) SYSTEM UPGRADE ASSESSMENT METHOD BASED ON SYSTEM PARAMETER CORRELATION COEFFICIENTS

(71) Applicant: NIO CO., LTD., Shanghai (CN)

(72) Inventors: Haitao Du, Shanghai (CN); Yicheng Wu, Shanghai (CN); Chongkui Jin, Shanghai (CN)

(73) Assignee: NIO CO., LTD., Shanghai (CN)

( * ) Notice: Subject to any disclaimer, the term of this patent is extended or adjusted under 35 U.S.C. 154(b) by 0 days.

(21) Appl. No.: 16/480,527

(22) PCT Filed: Jul. 31, 2017

(86) PCT No.: PCT/CN2017/095194
§ 371 (c)(1),
(2) Date: Jul. 24, 2019

(87) PCT Pub. No.: WO2018/137324
PCT Pub. Date: Aug. 2, 2018

(65) Prior Publication Data
US 2019/0384589 A1    Dec. 19, 2019

(30) Foreign Application Priority Data
Jan. 25, 2017  (CN) .......................... 201710062826.4

(51) Int. Cl.
*G01R 31/08*  (2020.01)
*G06F 17/00*  (2019.01)
(Continued)

(52) U.S. Cl.
CPC ................ *G06F 8/65* (2013.01); *G06F 17/15* (2013.01); *G01R 31/36* (2013.01);
(Continued)

(58) Field of Classification Search
CPC ........... G06F 8/65; G06F 17/15; G01R 31/36; G01R 31/388; G01R 31/392; G01R 31/3648
See application file for complete search history.

(56) References Cited

U.S. PATENT DOCUMENTS 3,917,990 A * 11/1975 Sherman, Jr. ......... H02J 7/0091
320/150
5,254,952 A * 10/1993 Salley ................... G01R 31/385
324/429

(Continued)

FOREIGN PATENT DOCUMENTS

| CN | 103324566 | 9/2013 |
| CN | 104573127 | 4/2015 |
| CN | 104993946 | 10/2015 |

OTHER PUBLICATIONS

Chih-Chieh Han et al., Sensor network software update management:a survey, 2005, [Retrieved on Jan. 25, 2021]. Retrieved from the internet: <URL: https://onlinelibrary.wiley.com/doi/epdf/10.1002/nem.574> 11 pp. (283-294) (Year: 2005).*

(Continued)

*Primary Examiner* — Anibal Rivera
(74) *Attorney, Agent, or Firm* — Sheridan Ross P.C.

(57) ABSTRACT

A system upgrade assessment method based on system parameter correlation coefficients is provided. The problem that the existing system upgrade assessment method cannot accurately assess an upgraded system is solved. For such a purpose, the system upgrade assessment method comprises the following steps: acquiring first data for a plurality of parameters before system upgrade (S110); acquiring second data for the plurality of parameters after the system upgrade (S120); calculating first correlation coefficients of the first data and second correlation coefficients of the second data (S130); calculating third correlation coefficients between the first data and the corresponding second data (S140); and (Continued)

determining, based on the magnitudes of the first correlation coefficients, the second correlation coefficients and the third correlation coefficients, whether the system upgrade succeeds (S150). By comparing the correlation coefficients of the system parameters before and after the upgrade, the system upgrade assessment method can accurately determine whether the system upgrade succeeds.

14 Claims, 4 Drawing Sheets

(51) Int. Cl.
    *G01R 31/36*     (2020.01)
    *G06F 8/65*     (2018.01)
    *G06F 17/15*     (2006.01)
    *G01R 31/392*     (2019.01)
    *G01R 31/388*     (2019.01)

(52) U.S. Cl.
    CPC ........ *G01R 31/3648* (2013.01); *G01R 31/388* (2019.01); *G01R 31/392* (2019.01)

(56) References Cited

U.S. PATENT DOCUMENTS

| | | | | |
|---|---|---|---|---|
| 5,736,835 | A * | 4/1998 | Nakajo | H01M 10/48 320/112 |
| 7,103,460 | B1 * | 9/2006 | Breed | B60C 23/0408 701/29.1 |
| 8,200,805 | B2 * | 6/2012 | Neuse | H04L 41/082 709/224 |
| 8,294,428 | B2 * | 10/2012 | Kakiuchi | H02J 7/0014 320/166 |
| 9,897,659 | B2 * | 2/2018 | Ishii | G01R 31/389 |
| 10,243,415 | B1 * | 3/2019 | Grundmann | H02J 50/05 |
| 2006/0013134 | A1 * | 1/2006 | Neuse | H04L 43/0882 370/230 |
| 2009/0256524 | A1 * | 10/2009 | Nukui | G01R 31/388 320/132 |
| 2010/0283434 | A1 * | 11/2010 | Kakiuchi | H02J 7/0014 320/166 |
| 2011/0004428 | A1 * | 1/2011 | Murochi | G01R 31/392 702/63 |
| 2011/0066331 | A1 * | 3/2011 | Yamashita | B62D 5/0463 701/42 |
| 2012/0083943 | A1 * | 4/2012 | Johansson | B60W 50/0097 701/1 |
| 2012/0083985 | A1 * | 4/2012 | Johansson | B60W 40/06 701/93 |
| 2012/0083986 | A1 * | 4/2012 | Johansson | B60W 30/143 701/93 |
| 2012/0089312 | A1 * | 4/2012 | Johansson | B60W 10/10 701/93 |
| 2012/0123651 | A1 * | 5/2012 | Johansson | F16H 61/0213 701/51 |
| 2012/0306450 | A1 * | 12/2012 | Nakayama | G01R 31/367 320/134 |
| 2012/0313562 | A1 * | 12/2012 | Murao | H02J 7/0021 318/139 |
| 2013/0035837 | A1 * | 2/2013 | Johansson | B60W 50/082 701/98 |
| 2013/0257372 | A1 * | 10/2013 | Chen | H02J 13/00034 320/109 |
| 2013/0266831 | A1 * | 10/2013 | Motohashi | H01M 10/425 429/61 |
| 2015/0112619 | A1 * | 4/2015 | Takahashi | G01R 31/3648 702/63 |
| 2015/0212161 | A1 * | 7/2015 | Soga | G01R 31/3648 702/63 |
| 2015/0331135 | A1 * | 11/2015 | Widmer | G01V 3/101 324/234 |
| 2015/0349385 | A1 * | 12/2015 | Hu | H01M 10/48 429/91 |
| 2016/0216336 | A1 * | 7/2016 | Ishii | H01M 10/48 |
| 2016/0274193 | A1 * | 9/2016 | Imaizumi | G01R 31/389 |
| 2016/0274963 | A1 | 9/2016 | Aisu et al. | |
| 2018/0083298 | A1 * | 3/2018 | Araki | H01M 8/04649 |
| 2019/0384589 | A1 * | 12/2019 | Du | G06F 8/65 |

OTHER PUBLICATIONS

International Search Report for International (PCT) Patent Application No. PCT/CN2017/095194, dated Sep. 26, 2017, 2 pages.

* cited by examiner

| Time<br>Parameter | 00:00 | 00:01 | ... | 23:59 |
|---|---|---|---|---|
| A | $A_1$ | $A_2$ | ... | $A_{1440}$ |
| B | $B_1$ | $B_2$ | ... | $B_{1440}$ |
| C | $C_1$ | $C_2$ | ... | $C_{1440}$ |

*Fig. 2*

| First correlation coefficient | A | B | C |
|---|---|---|---|
| A | 1 | | |
| B | $r_{AB}$ | 1 | |
| C | $r_{AC}$ | $r_{BC}$ | 1 |

*Fig. 3*

| Time<br>Parameter | 00:00 | 00:01 | ... | 23:59 |
|---|---|---|---|---|
| A' | $A_1'$ | $A_2'$ | ... | $A_{1440}'$ |
| B' | $B_1'$ | $B_2'$ | ... | $B_{1440}'$ |
| C' | $C_1'$ | $C_2'$ | ... | $C_{1440}'$ |

*Fig. 4*

| Second correlation coefficient | A' | B' | C' |
|---|---|---|---|
| A' | 1 | | |
| B' | $r_{A'B'}$ | 1 | |
| C' | $r_{A'C'}$ | $r_{B'C'}$ | 1 |

*Fig. 5*

| Third correlation coefficient | A' | B' | C' |
|---|---|---|---|
| A | $r_{AA'}$ | | |
| B | | $r_{BB'}$ | |
| C | | | $r_{CC'}$ |

SYSTEM UPGRADE ASSESSMENT METHOD BASED ON SYSTEM PARAMETER CORRELATION COEFFICIENTS

CROSS REFERENCE TO RELATED APPLICATIONS

This application is a national stage application under 35 U.S.C. 371 and claims the benefit of PCT Application No. PCT/CN2017/095194 having an international filing date of 31 Jul. 2017, which designated the United States, which PCT application claimed the benefit of China Patent Application No. 201710062826.4 filed 25 Jan. 2017, the disclosure of each of which are incorporated herein by reference.

TECHNICAL FIELD

The invention relates to the field of system upgrade assessment, and specifically provides a system upgrade assessment method based on system parameter correlation coefficients.

BACKGROUND ART

In the prior art, when a system (e.g., a control system for a battery swapping station) is upgraded, a strategy of first gray-scale upgrade (first upgrade to small-range devices) and then gradual comprehensive upgrade is generally used, and then the upgrade results of gray-scale upgrade devices and comprehensive upgrade devices are assessed. The assessment method for upgrade results usually makes a determination by comparing system/device faults and whether the values of key parameters are still within a threshold range before and after the upgrade.

However, there are certain defects in this method. Specifically, some faults have a "cumulative effect" that is usually reflected after a period of time the upgrade is ended; moreover, the key parameters change within the threshold range, which does not mean that the changes of the parameters before and after the upgrade are still normal changes.

Accordingly, a new system upgrade assessment method is required in the art to solve the problems.

SUMMARY OF THE INVENTION

In order to solve the problems in the prior art, that is, in order to solve the problem that the existing system upgrade assessment method cannot accurately assess an upgraded system, the invention provides a system upgrade assessment method based on system parameter correlation coefficients. The system upgrade assessment method comprises the following steps: acquiring first data for a plurality of parameters before system upgrade; acquiring second data for the plurality of parameters after the system upgrade; calculating first correlation coefficients of the first data for the parameters and second correlation coefficients of the second data for the parameters; calculating third correlation coefficients between the first data for the parameters and the corresponding second data for the parameters; and determining, based on the magnitudes of the first correlation coefficients, the second correlation coefficients and the third correlation coefficients, whether the system upgrade succeeds.

In a preferred technical solution of the system upgrade assessment method, the step of "determining, based on the magnitudes of the first correlation coefficients, the second correlation coefficients and the third correlation coefficients, whether the system upgrade succeeds" further comprises: calculating first absolute values of differences between the first correlation coefficients and the corresponding second correlation coefficients; calculating second absolute values of differences between the third correlation coefficients and 1; and determining, based on the magnitudes of the first absolute values and the second absolute values, whether the system upgrade succeeds.

In a preferred technical solution of the system upgrade assessment method, the step of "determining, based on the magnitudes of the first absolute values and the second absolute values, whether the system upgrade succeeds" further comprises: determining, when the first absolute values are less than a set first threshold and the second absolute values are less than a set second threshold, that the system upgrade succeeds; otherwise, determining that the system upgrade fails.

In a preferred technical solution of the system upgrade assessment method, the steps of "acquiring first data for a plurality of parameters before system upgrade" and "acquiring second data for the plurality of parameters after the system upgrade" are performed N times at a constant or variable time interval, and each of the steps of calculating the first correlation coefficients, calculating the second correlation coefficients, and calculating the third correlation coefficients is performed by the following formula:

$$r_{AB} = \frac{\sum_{i=1}^{N}(A_i - \overline{A})(B_i - \overline{B})}{\sqrt{\sum_{i=1}^{N}(A_i - \overline{A})^2}\sqrt{\sum_{i=1}^{N}(B_i - \overline{B})^2}}$$

where when $r_{AB}$ represents the first correlation coefficient, $\overline{A}$ represents an average value of one parameter of the plurality of parameters in N times of sampling before system upgrade, $A_i$ represents an actual value of the one parameter in each of the N times of sampling before system upgrade, $\overline{B}$ represents an average value of another parameter of the plurality of parameters in N times of sampling before system upgrade, and $B_i$ represents an actual value of the another parameter in each of the N times of sampling before system upgrade; when $r_{AB}$ represents the second correlation coefficient, $\overline{A}$ represents an average value of one parameter of the plurality of parameters in N times of sampling after system upgrade, $A_i$ represents an actual value of the one parameter in each of the N times of sampling after system upgrade, $\overline{B}$ represents an average value of another parameter of the plurality of parameters in N times of sampling after system upgrade, and $B_i$ represents an actual value of the another parameter in each of the N times of sampling after system upgrade; and when $r_{AB}$ represents the third correlation coefficient, $\overline{A}$ represents an average value of one parameter of the plurality of parameters in N times of sampling before system upgrade, $A_i$ represents an actual value of the one parameter in each of the N times of sampling before system upgrade, $\overline{B}$ represents an average value of the one parameter in N times of sampling after system upgrade, and $B_i$ represents an actual value of the one parameter in each of the N times of sampling after system upgrade.

In a preferred technical solution of the system upgrade assessment method, the system is a software system for a battery charging and swapping facility.

In a preferred technical solution of the system upgrade assessment method, the battery charging and swapping facility is a charging station, a battery swapping station, a movable charging vehicle, a movable battery swapping vehicle or a charging pile.

In addition, the invention also provides a system upgrade assessment method based on system parameter correlation coefficients. The method comprises the following steps: acquiring first data for a plurality of parameters before system upgrade; acquiring second data for the plurality of parameters after the system upgrade; calculating first correlation coefficients of the first data for the parameters; calculating second correlation coefficients of the second data for the parameters; and determining, based on the magnitudes of the first correlation coefficients and the second correlation coefficients, whether the system upgrade succeeds.

In a preferred technical solution of the system upgrade assessment method, the step of "determining, based on the magnitudes of the first correlation coefficients and the second correlation coefficients, whether the system upgrade succeeds" further comprises: calculating absolute values of differences between the first correlation coefficients and the corresponding second correlation coefficients; and determining, based on the magnitudes of the absolute values, whether the system upgrade succeeds.

In a preferred technical solution of the system upgrade assessment method, the step of "determining, based on the magnitudes of the absolute values, whether the system upgrade succeeds" further comprises: determining, when the absolute values are less than a set threshold, that the system upgrade succeeds; otherwise, determining that the system upgrade fails.

In a preferred technical solution of the system upgrade assessment method, the steps of "acquiring first data for a plurality of parameters before system upgrade" and "acquiring second data for the plurality of parameters after the system upgrade" are performed N times at a constant or variable time interval, and each of the steps of calculating the first correlation coefficients and calculating the second correlation coefficients is performed by the following formula:

$$r_{AB} = \frac{\sum_{i=1}^{N}(A_i - \overline{A})(B_i - \overline{B})}{\sqrt{\sum_{i=1}^{N}(A_i - \overline{A})^2}\sqrt{\sum_{i=1}^{N}(B_i - \overline{B})^2}}$$

where when $r_{AB}$ represents the first correlation coefficient, $\overline{A}$ represents an average value of one parameter of the plurality of parameters in N times of sampling before system upgrade, $A_i$ represents an actual value of the one parameter in each of the N times of sampling before system upgrade, $\overline{B}$ represents an average value of another parameter of the plurality of parameters in N times of sampling before system upgrade, and $B_i$ represents an actual value of the another parameter in each of the N times of sampling before system upgrade; and when $r_{AB}$ represents the second correlation coefficient, $\overline{A}$ represents an average value of one parameter of the plurality of parameters in N times of sampling after system upgrade, $A_i$ represents an actual value of the one parameter in each of the N times of sampling after system upgrade, $\overline{B}$ represents an average value of another parameter of the plurality of parameters in N times of sampling after system upgrade, and $B_i$ represents an actual value of the another parameter in each of the N times of sampling after system upgrade.

In a preferred technical solution of the system upgrade assessment method, the system is a software system for a battery charging and swapping facility.

In a preferred technical solution of the system upgrade assessment method, the battery charging and swapping facility is a charging station, a battery swapping station, a movable charging vehicle, a movable battery swapping vehicle or a charging pile.

It could be understood by those skilled in the art that, in a preferred technical solution of the invention, first data for a plurality of parameters before system upgrade and second data for the plurality of parameters after the system upgrade are acquired first. Then, first correlation coefficients of the first data, second correlation coefficients of the second data, and third correlation coefficients between the first data and the corresponding second data are calculated. Finally, first absolute values of differences between the first correlation coefficients and the corresponding second correlation coefficients are calculated, and absolute values of differences between the third correlation coefficients and 1 are calculated. When the first absolute values are less than a set threshold and the second absolute values are less than a set second threshold, it is determined that the system upgrade succeeds, otherwise, the system upgrade fails.

It is easily understood by those skilled in the art that, whether the system upgrade succeeds may be determined only by using the first absolute values, so those skilled in the art may determine, based on the magnitudes of the first absolute values as needed, whether the system upgrade succeeds.

Therefore, the system assessment upgrade method of the invention can accurately determine whether the system upgrade succeeds, thereby effectively avoiding the cumulative effect of faults during the system upgrade. In addition, the system upgrade assessment method of the invention can easily obtain the parameters of upgrade failure and thus obtain the cause of the system upgrade failure, thereby facilitating upgrade personnel in finding the cause of the system upgrade failure.

BRIEF DESCRIPTION OF THE DRAWINGS

FIG. 2 is a table of system parameters collected before system upgrade;

FIG. 3 is a table of first correlation coefficients before system upgrade;

FIG. 4 is a table of system parameters collected after system upgrade;

FIG. 5 is a table of second correlation coefficients after system upgrade;

FIG. 6 is a table of third correlation coefficients; and

DETAILED DESCRIPTION OF EMBODIMENTS

Preferred embodiments of the invention are described below with reference to the accompanying drawings. It should be understood by those skilled in the art that these embodiments are only for explaining the technical principles of the invention and are not intended to limit the scope of protection of the invention. For example, although the Description is illustrated by way of an example of a control system for a battery swapping station for electric vehicles, it is apparent that the system upgrade assessment method of the invention is applicable to any system that needs to be upgraded, and those skilled in the art can make an adjustment as needed to adapt to specific application scenarios.

Figure 1:
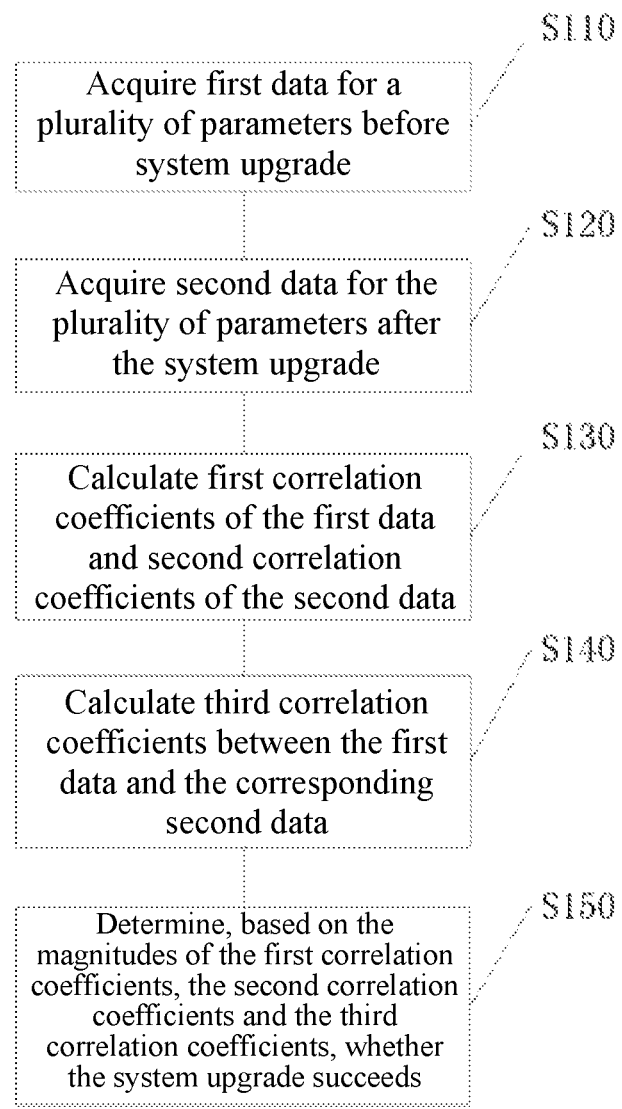
FIG. 1 is a flowchart of steps of a system upgrade assessment method based on system parameter correlation coefficients of the invention.

As shown in FIG. 1, a system upgrade assessment method based on system parameter correlation coefficients of the invention includes: step S110, acquiring first data for a plurality of parameters before system upgrade; step S120, acquiring second data for the plurality of parameters after the system upgrade; step S130, calculating first correlation coefficients of the first data and second correlation coefficients of the second data; step S140, calculating third correlation coefficients between the first data and the corresponding second data; and step S150, determining, based on the magnitudes of the first correlation coefficients, the second correlation coefficients and the third correlation coefficients, whether the system upgrade succeeds. It should be noted that the system of the invention may be any software system that needs to be upgraded.

Specifically, in step S110, first data for a plurality of parameters of a system that is normally operating before upgrade are collected first, with the collection operation being performed multiple times at a constant time interval or a varying time interval, and the first data being a plurality of collected values of the plurality of parameters at multiple different times within a period of time. Preferably, the plurality of parameters are key parameters of the system, and the key parameters are parameters that can play a decisive role for system operating performance. Alternatively, those skilled in the art may appropriately adjust the selection of and the number of key parameters based on actual needs. Further, those skilled in the art may also select all parameters of the entire system and acquire first data of all the parameters as needed.

Specifically, in step S120, second data for the same plurality of parameters of the system after same is upgraded are collected first, with the collection operation being also performed multiple times at a constant time interval or a varying time interval, and the second data being a plurality of collected values of the plurality of parameters at multiple different times within a period of time.

Specifically, in step S130, first correlation coefficients of the first data for the parameters acquired in step S110 are calculated, and second correlation coefficients of the second data for the parameters acquired in step S120 are calculated. It should be noted that the first correlation coefficients and the second correlation coefficients are obtained from two key parameters by calculation through a formula (described in detail below).

Specifically, in step S140, third correlation coefficients between the first data for the parameters that are acquired in step S110 and the second data for the same parameters that are acquired in step S120 are calculated. The third correlation coefficients are obtained from the corresponding first data and second data by calculation through the same formula as that in step S130 (described in detail below).

Specifically, in step S150, first, differences between the corresponding first correlation coefficients and second correlation coefficients are calculated, and absolute values of the results are solved to obtain first absolute values. Next, differences between the third correlation coefficients and the number 1 are calculated, and absolute values of the results are solved to obtain second absolute values. Then, when the first absolute values are less than a set first threshold and the second absolute values are less than a set second threshold, it is determined that the system upgrade succeeds; and when the first absolute values are greater than or equal to the set first threshold or the second absolute values are greater than or equal to the set second threshold, it is determined that the system upgrade fails. The first threshold and the second threshold may be set by those skilled in the art based on the type of the system to be upgraded and by trial or based on the desired performance to be achieved after the system upgrade.

Regarding the method, it should be noted that although the method has been described in a specific order in this application, this is not restrictive, and those skilled in the art may adjust the order of the steps as needed. For example, step S130 may be split into two sub-steps for respectively calculating the first correlation coefficients and the second correlation coefficients, wherein the sub-step of calculating the first correlation coefficients may be performed before step S120, and the sub-step of calculating the second correlation coefficients may be performed after step S120. Moreover, step S140 may also be performed before the current step S130, or before the sub-step of calculating the second correlation coefficients. These variations and adjustments do not depart from the principles of the invention, and therefore will fall within the scope of protection of the invention.

The system upgrade assessment method of the invention will be described in detail below with reference to FIGS. 2 to 6, taking a control system for a battery swapping station for electric vehicles as an example.

As shown in FIG. 2, first, a plurality of parameters, such as A, B, and C, are selected for the system before same is upgraded, where A represents a charging current of the battery swapping station for a traction battery, B represents a charging voltage of the battery swapping station for the traction battery, and C represents a charging efficiency of the battery swapping station for the traction battery. It could be understood by those skilled in the art that the key parameters of the control system for the battery swapping station for electric vehicles are not limited to the charging current, the charging voltage and the charging efficiency, and those skilled in the art may appropriately adjust the key parameters as needed, as long as the upgraded system can be accurately assessed. Then, data (i.e., first data) is collected one every 1 minute for A, B, and C, and recorded.

As shown in FIG. 3, first correlation coefficients among the parameters A, B, and C may be calculated according to the following correlation coefficient formula, $$r_{AB} = \frac{\sum_{i=1}^{N}(A_i - \overline{A})(B_i - \overline{B})}{\sqrt{\sum_{i=1}^{N}(A_i - \overline{A})^2}\sqrt{\sum_{i=1}^{N}(B_i - \overline{B})^2}}$$

where i is a positive integer from 1 to 1140, $r_{AB}$ represents a first correlation coefficient between parameters A and B, $\overline{A}$ represents an average value of parameter A in 1440 sampling points, $\overline{B}$ represents an average value of parameter B in 1440 sampling points, $A_i$ represents an actual value of parameter A in each of the 1440 sampling points before system upgrade, and $B_i$ represents an actual value of parameter B in each of the 1440 sampling points before system upgrade.

Further, the first data of A and C are substituted into formula (1) to obtain a correlation coefficient $r_{AC}$ (first correlation coefficient) between A and C, and the first data of B and C are substituted into formula (1) to obtain a correlation coefficient $r_{BC}$ (first correlation coefficient) between B and C.

As shown in FIG. 4, the charging current, the charging voltage, and the charging efficiency after the system upgrade are respectively denoted by A', B', and C', and data (i.e., second data) is collected once every 1 minute.

FIG. 5 shows second correlation coefficients between the parameters after the system upgrade. Specifically, the second data of A' and B' are substituted into formula (1) to obtain a correlation coefficient $r_{A'B'}$ (second correlation coefficient) between A' and B', the second data of A' and C' are substituted into formula (1) to obtain a correlation coefficient $r_{A'C'}$ (second correlation coefficient) between A' and C', and the second data of B' and C' are substituted into formula (1) to obtain a correlation coefficient $r_{B'C'}$ (second correlation coefficient) between B' and C'.

FIG. 6 shows third correlation coefficients between the first data and the second data of the same parameters before and after the system upgrade. Specifically, the first data of A and the second data of A' are substituted into formula (1) to obtain a correlation coefficient $r_{AA'}$ (third correlation coefficient) between A and A', the first data of B and the second data of B' are substituted into formula (1) to obtain a correlation coefficient $r_{BB'}$ (third correlation coefficient) between B and B', and the first data of C and the second data of C' are substituted into formula (1) to obtain a correlation coefficient $r_{CC'}$ (third correlation coefficient) between C and C'.

It should be noted that the greater the absolute value of the correlation coefficient r, the stronger the correlation, that is, the closer to 1 or −1 the correlation coefficient r, the stronger the correlation, otherwise, the closer to 0 the correlation coefficient r, the weaker the correlation. Preferably, the strength of correlation between the system parameters is determined by the following range of values (the value is the absolute value of the correlation coefficient r):

0.8-1.0 extremely strong correlation;
0.6-0.8 strong correlation;
0.4-0.6 medium correlation;
0.2-0.4 weak correlation;
0.0-0.2 extremely weak correlation or non-correlation.

Therefore, the condition that the system upgrade succeeds is: $|r_{A'B'}-r_{AB}|<\sigma_1$ and $|r_{A'C'}-r_{AC}|<\sigma_1$ and $|r_{B'C'}-r_{BC}|<\sigma_1$ and $|1-r_{AA'}|<\sigma_2$ and $|1-r_{BB'}|<\sigma_2$ and $|1-r_{CC'}|<\sigma_2$. Conversely, when $|r_{A'B'}-r_{AB}|>\sigma_1$ or $|r_{A'C'}-r_{AC}|>\sigma_1$ or $|r_{B'C'}-r_{BC}|>\sigma_1$ or $|1-r_{AA'}|>\sigma_2$ or $|1-r_{BB'}|>\sigma_2$ or $|1-r_{CC'}|>\sigma_2$, it is determined that the system upgrade fails.

$\sigma_1$ and $\sigma_2$ are respectively a first threshold and a second threshold within a reasonable change interval (e.g., $\sigma_1=0.1$, $\sigma_2=0.2$), or those skilled in the art may also appropriately adjust the values of $\sigma_1$ and $\sigma_2$ according to different software systems and different needs, as long as the upgraded system can be accurately assessed.

In summary, the system upgrade assessment method based on system parameter correlation coefficients of the invention assesses a system before and after upgrade by changes in correlation coefficients of system parameters (especially key parameters), which can reflect the trend difference of the system before and after the upgrade, so that the upgraded system can be accurately assessed. Moreover, the system upgrade assessment method of the invention can easily obtain the parameters of upgrade failure and further obtain the cause of the system upgrade failure, thus facilitating upgrade personnel in finding the cause of the system upgrade failure.

It is not difficult to see from the above that the first absolute values and the second absolute values are both obtained from the first data and the second data of the corresponding parameters before and after the system upgrade, and compared with the second absolute values, the first absolute values can better reflect the trend difference before and after the system upgrade. Therefore, it may be determined, only by the magnitudes of the first absolute values, whether the system upgrade succeeds.

Figure 7:
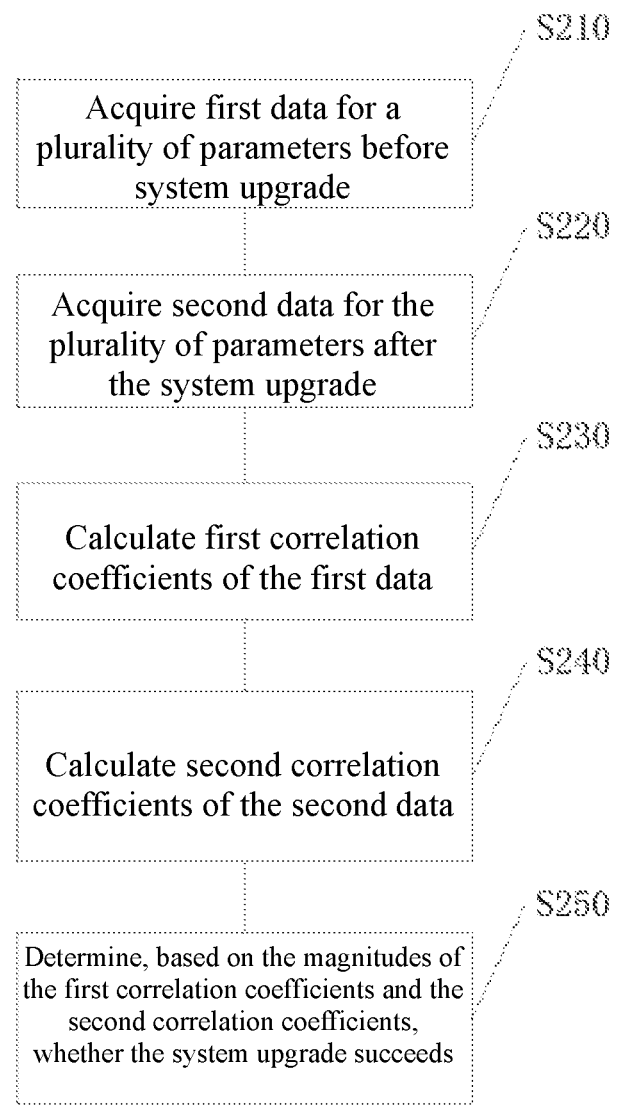
FIG. 7 is a flowchart of steps of another system upgrade assessment method based on system parameter correlation coefficients of the invention.

Specifically, as shown in FIG. 7, another embodiment of the system upgrade assessment method based on system parameter correlation coefficients of the invention includes: step S210, acquiring first data for a plurality of parameters before system upgrade; step S220, acquiring second data for the plurality of parameters after the system upgrade; step S230, calculating first correlation coefficients of the first data for the parameters; step S240, calculating second correlation coefficients of the second data for the parameters; and step S250, determining, based on the magnitudes of the first correlation coefficients and the second correlation coefficients, whether the system upgrade succeeds Similarly, the steps S230 and S220 may also be interchanged in their order without departing from the basic principle and scope of protection of the invention.

Because the acquisition of the parameters and the calculation of the correlation coefficients have been described in detail above, no further description is given here.

Heretofore, the technical solutions of the invention have been described in conjunction with the preferred embodiments shown in the drawings; however, it could be easily understood by those skilled in the art that the scope of protection of the invention is obviously not limited to these specific embodiments. Those skilled in the art can make equivalent changes or substitutions to the related technical features without departing from the principles of the invention, and all the technical solutions after the changes or substitutions will fall within the scope of protection of the invention.

What is claimed is:

1. A system upgrade assessment method based on system parameter correlation coefficients, comprising the following steps:
   acquiring first data for a plurality of parameters before system upgrade;
   acquiring second data for the plurality of parameters after the system upgrade;
   calculating first correlation coefficients of the first data for the parameters and second correlation coefficients of the second data for the parameters;
   calculating third correlation coefficients between the first data for the parameters and the corresponding second data for the parameters;
   and determining, based on the magnitudes of the first correlation coefficients, the second correlation coefficients and the third correlation coefficients, whether the system upgrade succeeds, wherein the system is a software system for a battery charging and swapping facility, and the system upgrade is from one version to another version of the software system.

2. The system upgrade assessment method based on system parameter correlation coefficients according to claim 1, wherein the step of "determining, based on the magnitudes of the first correlation coefficients, the second correlation coefficients and the third correlation coefficients, whether the system upgrade succeeds" further comprises:

calculating first absolute values of differences between the first correlation coefficients and the corresponding second correlation coefficients;

calculating second absolute values of differences between the third correlation coefficients and 1;

and determining, based on the magnitudes of the first absolute values and the second absolute values, whether the system upgrade succeeds.

3. The system upgrade assessment method based on system parameter correlation coefficients according to claim 2, wherein the step of "determining, based on the magnitudes of the first absolute values and the second absolute values, whether the system upgrade succeeds" further comprises:

determining, when the first absolute values are less than a set first threshold and the second absolute values are less than a set second threshold, that the system upgrade succeeds; otherwise, determining that the system upgrade fails.

4. The system upgrade assessment method based on system parameter correlation coefficients according to claim 1, wherein the steps of "acquiring first data for a plurality of parameters before system upgrade" and "acquiring second data for the plurality of parameters after the system upgrade" are performed N times at a constant or variable time interval, and each of the steps of calculating the first correlation coefficients, calculating the second correlation coefficients, and calculating the third correlation coefficients is performed by the following formula:

$$r_{AB} = \frac{\sum_{i=1}^{N}(A_i - \overline{A})(B_i - \overline{B})}{\sqrt{\sum_{i=1}^{N}(A_i - \overline{A})^2}\sqrt{\sum_{i=1}^{N}(B_i - \overline{B})^2}}$$

where when $r_{AB}$ represents the first correlation coefficient, $\overline{A}$ represents an average value of one parameter of the plurality of parameters in N times of sampling before system upgrade, $A_i$ represents an actual value of the one parameter in each of the N times of sampling before system upgrade, $\overline{B}$ represents an average value of another parameter of the plurality of parameters in N times of sampling before system upgrade, and $B_i$ represents an actual value of the another parameter in each of the N times of sampling before system upgrade;

when $r_{AB}$ represents the second correlation coefficient, $\overline{A}$ represents an average value of one parameter of the plurality of parameters in N times of sampling after system upgrade, $A_i$ represents an actual value of the one parameter in each of the N times of sampling after system upgrade, $\overline{B}$ represents an average value of another parameter of the plurality of parameters in N times of sampling after system upgrade, and $B_i$ represents an actual value of the another parameter in each of the N times of sampling after system upgrade; and when $r_{AB}$ represents the third correlation coefficient, $\overline{A}$ represents an average value of one parameter of the plurality of parameters in N times of sampling before system upgrade, $A_i$ represents an actual value of the one parameter in each of the N times of sampling before system upgrade, $\overline{B}$ represents an average value of the one parameter in N times of sampling after system upgrade, and $B_i$ represents an actual value of the one parameter in each of the N times of sampling after system upgrade.

5. The system upgrade assessment method based on system parameter correlation coefficients according to claim 1, wherein the battery charging and swapping facility is a charging station, a battery swapping station, a movable charging vehicle, a movable battery swapping vehicle or a charging pile.

6. The system upgrade assessment method based on system parameter correlation coefficients according to claim 2, wherein the steps of "acquiring first data for a plurality of parameters before system upgrade" and "acquiring second data for the plurality of parameters after the system upgrade" are performed N times at a constant or variable time interval, and each of the steps of calculating the first correlation coefficients, calculating the second correlation coefficients, and calculating the third correlation coefficients is performed by the following formula:

$$r_{AB} = \frac{\sum_{i=1}^{N}(A_i - \overline{A})(B_i - \overline{B})}{\sqrt{\sum_{i=1}^{N}(A_i - \overline{A})^2}\sqrt{\sum_{i=1}^{N}(B_i - \overline{B})^2}}$$

where when $r_{AB}$ represents the first correlation coefficient, $\overline{A}$ represents an average value of one parameter of the plurality of parameters in N times of sampling before system upgrade, $A_i$ represents an actual value of the one parameter in each of the N times of sampling before system upgrade, $\overline{B}$ represents an average value of another parameter of the plurality of parameters in N times of sampling before system upgrade, and $B_i$ represents an actual value of the another parameter in each of the N times of sampling before system upgrade;

when $r_{AB}$ represents the second correlation coefficient, $\overline{A}$ represents an average value of one parameter of the plurality of parameters in N times of sampling after system upgrade, $A_i$ represents an actual value of the one parameter in each of the N times of sampling after system upgrade, $\overline{B}$ represents an average value of another parameter of the plurality of parameters in N times of sampling after system upgrade, and $B_i$ represents an actual value of the another parameter in each of the N times of sampling after system upgrade; and when $r_{AB}$ represents the third correlation coefficient, $\overline{A}$ represents an average value of one parameter of the plurality of parameters in N times of sampling before system upgrade, $A_i$ represents an actual value of the one parameter in each of the N times of sampling before system upgrade, $\overline{B}$ represents an average value of the one parameter in N times of sampling after system upgrade, and $B_i$ represents an actual value of the one parameter in each of the N times of sampling after system upgrade.

7. The system upgrade assessment method based on system parameter correlation coefficients according to claim 3, wherein the steps of "acquiring first data for a plurality of parameters before system upgrade" and "acquiring second data for the plurality of parameters after the system upgrade" are performed N times at a constant or variable time interval, and each of the steps of calculating the first correlation coefficients, calculating the second correlation coefficients, and calculating the third correlation coefficients is performed by the following formula:

$$r_{AB} = \frac{\sum_{i=1}^{N}(A_i - \overline{A})(B_i - \overline{B})}{\sqrt{\sum_{i=1}^{N}(A_i - \overline{A})^2}\sqrt{\sum_{i=1}^{N}(B_i - \overline{B})^2}}$$

where when $r_{AB}$ represents the first correlation coefficient, $\overline{A}$ represents an average value of one parameter of the plurality of parameters in N times of sampling before system upgrade, $A_i$ represents an actual value of the one parameter in each of the N times of sampling before system upgrade, $\overline{B}$ represents an average value of another parameter of the plurality of parameters in N times of sampling before system upgrade, and $B_i$ represents an actual value of the another parameter in each of the N times of sampling before system upgrade;

when $r_{AB}$ represents the second correlation coefficient, $\overline{A}$ represents an average value of one parameter of the plurality of parameters in N times of sampling after system upgrade, $A_i$ represents an actual value of the one parameter in each of the N times of sampling after system upgrade, $\overline{B}$ represents an average value of another parameter of the plurality of parameters in N times of sampling after system upgrade, and $B_i$ represents an actual value of the another parameter in each of the N times of sampling after system upgrade; and when $r_{AB}$ represents the third correlation coefficient, $\overline{A}$ represents an average value of one parameter of the plurality of parameters in N times of sampling before system upgrade, $A_i$ represents an actual value of the one parameter in each of the N times of sampling before system upgrade, $\overline{B}$ represents an average value of the one parameter in N times of sampling after system upgrade, and $B_i$ represents an actual value of the one parameter in each of the N times of sampling after system upgrade.

8. A system upgrade assessment method based on system parameter correlation coefficients, comprising the following steps:
   acquiring first data for a plurality of parameters before system upgrade;
   acquiring second data for the plurality of parameters after the system upgrade;
   calculating first correlation coefficients of the first data for the parameters;
   calculating second correlation coefficients of the second data for the parameters;
   and determining, based on the magnitudes of the first correlation coefficients and the second correlation coefficients, whether the system upgrade succeeds, wherein the system is a software system for a battery charging and swapping facility, and the system upgrade is from one version to another version of the software system.

9. The system upgrade assessment method based on system parameter correlation coefficients according to claim 8, wherein the step of "determining, based on the magnitudes of the first correlation coefficients and the second correlation coefficients, whether the system upgrade succeeds" further comprises:
   calculating absolute values of differences between the first correlation coefficients and the corresponding second correlation coefficients;
   and determining, based on the magnitudes of the absolute values, whether the system upgrade succeeds.

10. The system upgrade assessment method based on system parameter correlation coefficients according to claim 9, wherein the step of "determining, based on the magnitudes of the absolute values, whether the system upgrade succeeds" further comprises:
   determining, when the absolute values are less than a set threshold, that the system upgrade succeeds; otherwise, determining that the system upgrade fails.

11. The system upgrade assessment method based on system parameter correlation coefficients according to claim 8, wherein the steps of "acquiring first data for a plurality of parameters before system upgrade" and "acquiring second data for the plurality of parameters after the system upgrade" are performed N times at a constant or variable time interval, and each of the steps of calculating the first correlation coefficients and calculating the second correlation coefficients is performed by the following formula:

$$r_{AB} = \frac{\sum_{i=1}^{N}(A_i - \overline{A})(B_i - \overline{B})}{\sqrt{\sum_{i=1}^{N}(A_i - \overline{A})^2}\sqrt{\sum_{i=1}^{N}(B_i - \overline{B})^2}}$$

where when $r_{AB}$ represents the first correlation coefficient, $\overline{A}$ represents an average value of one parameter of the plurality of parameters in N times of sampling before system upgrade, $A_i$ represents an actual value of the one parameter in each of the N times of sampling before system upgrade, $\overline{B}$ represents an average value of another parameter of the plurality of parameters in N times of sampling before system upgrade, and $B_i$ represents an actual value of the another parameter in each of N times of sampling before system upgrade; and when $r_{AB}$ represents the second correlation coefficient, $\overline{A}$ represents an average value of one parameter of the plurality of parameters in N times of sampling after system upgrade, $A_i$ represents an actual value of the one parameter in each of the N times of sampling after system upgrade, $\overline{B}$ represents an average value of another parameter of the plurality of parameters in N times of sampling after system upgrade, and $B_i$ represents an actual value of the another parameter in each of the N times of sampling after system upgrade.

12. The system upgrade assessment method based on system parameter correlation coefficients according to claim 8, wherein the battery charging and swapping facility is a charging station, a battery swapping station, a movable charging vehicle, a movable battery swapping vehicle or a charging pile.

13. The system upgrade assessment method based on system parameter correlation coefficients according to claim 9, wherein the steps of "acquiring first data for a plurality of parameters before system upgrade" and "acquiring second data for the plurality of parameters after the system upgrade" are performed N times at a constant or variable time interval, and each of the steps of calculating the first correlation coefficients and calculating the second correlation coefficients is performed by the following formula:

$$r_{AB} = \frac{\sum_{i=1}^{N}(A_i - \overline{A})(B_i - \overline{B})}{\sqrt{\sum_{i=1}^{N}(A_i - \overline{A})^2}\sqrt{\sum_{i=1}^{N}(B_i - \overline{B})^2}}$$

where when $r_{AB}$ represents the first correlation coefficient, $\overline{A}$ represents an average value of one parameter of the plurality of parameters in N times of sampling before system upgrade, $A_i$ represents an actual value of the one parameter in each of the N times of sampling before system upgrade, $\overline{B}$ represents an average value of another parameter of the plurality of parameters in N times of sampling before system upgrade, and $B_i$ represents an actual value of the another parameter in each of N times of sampling before system upgrade; and when $r_{AB}$ represents the second correlation coefficient, $\overline{A}$ represents an average value of one parameter of the plurality of parameters in N times of sampling after system upgrade, $A_i$ represents an actual value of the one parameter in each of the N times of sampling after system upgrade, $\overline{B}$ represents an average value of another parameter of the plurality of parameters in N times of sampling after system upgrade, and $B_i$ represents an actual value of the another parameter in each of the N times of sampling after system upgrade.

14. The system upgrade assessment method based on system parameter correlation coefficients according to claim 10, wherein the steps of "acquiring first data for a plurality of parameters before system upgrade" and "acquiring second data for the plurality of parameters after the system upgrade" are performed N times at a constant or variable time interval, and each of the steps of calculating the first correlation coefficients and calculating the second correlation coefficients is performed by the following formula:

$$r_{AB} = \frac{\sum_{i=1}^{N}(A_i - \overline{A})(B_i - \overline{B})}{\sqrt{\sum_{i=1}^{N}(A_i - \overline{A})^2}\sqrt{\sum_{i=1}^{N}(B_i - \overline{B})^2}}$$

where when $r_{AB}$ represents the first correlation coefficient, $\overline{A}$ represents an average value of one parameter of the plurality of parameters in N times of sampling before system upgrade, $A_i$ represents an actual value of the one parameter in each of the N times of sampling before system upgrade, $\overline{B}$ represents an average value of another parameter of the plurality of parameters in N times of sampling before system upgrade, and $B_i$ represents an actual value of the another parameter in each of N times of sampling before system upgrade; and when $r_{AB}$ represents the second correlation coefficient, $\overline{A}$ represents an average value of one parameter of the plurality of parameters in N times of sampling after system upgrade, $A_i$ represents an actual value of the one parameter in each of the N times of sampling after system upgrade, $\overline{B}$ represents an average value of another parameter of the plurality of parameters in N times of sampling after system upgrade, and $B_i$ represents an actual value of the another parameter in each of the N times of sampling after system upgrade.

\* \* \* \* \*